(12) United States Patent
Lester (10) Patent No.: US 7,674,639 B2
(45) Date of Patent: Mar. 9, 2010

(54) GAN BASED LED WITH ETCHED EXPOSED SURFACE FOR IMPROVED LIGHT EXTRACTION EFFICIENCY AND METHOD FOR MAKING THE SAME

(75) Inventor: Steven D. Lester, Palo Alto, CA (US)

(73) Assignee: Bridgelux, Inc, Sunnyvale, CA (US)

( * ) Notice: Subject to any disclaimer, the term of this patent is extended or adjusted under 35 U.S.C. 154(b) by 213 days.

(21) Appl. No.: 11/504,435

(22) Filed: Aug. 14, 2006

(65) Prior Publication Data

US 2008/0035936 A1 Feb. 14, 2008

(51) Int. Cl.
*H01L 21/00* (2006.01)
(52) U.S. Cl. ............... 438/22; 257/79; 257/E33.001
(58) Field of Classification Search ............ 438/22, 438/28, 40, 42, 43, 46, 718, 745; 427/255.34; 257/79, E33.001
See application file for complete search history.

(56) References Cited

U.S. PATENT DOCUMENTS

| | | | |
|---|---|---|---|
| 5,557,115 A | 9/1996 | Shakuda | |
| 5,779,924 A | 7/1998 | Krames et al. | |
| 5,793,062 A | 8/1998 | Kish et al. | |
| 6,091,085 A | 7/2000 | Lester et al. | |
| 6,410,942 B1 | 6/2002 | Thibeault et al. | |
| 6,441,403 B1* | 8/2002 | Chang et al. | 257/94 |
| 6,488,767 B1* | 12/2002 | Xu et al. | 117/2 |
| 6,657,236 B1 | 12/2003 | Thibeault et al. | |
| 6,746,889 B1 | 6/2004 | Eliashevich et al. | |
| 2005/0121679 A1 | 6/2005 | Nagahama et al. | |
| 2005/0139840 A1 | 6/2005 | Lai et al. | |
| 2006/0154391 A1 | 7/2006 | Tran et al. | |
| 2007/0121690 A1* | 5/2007 | Fujii et al. | 372/43.01 |

OTHER PUBLICATIONS

Ramachandran and Feenstra, et al—"Inversion of Wurtzite GaN (0001) by Exposure to Magnesium" Applied Physics Letters. vol. 75 No. 6, Aug. 9, 1999.

* cited by examiner

*Primary Examiner*—Ha Tran T Nguyen
*Assistant Examiner*—Shaun Campbell
(74) *Attorney, Agent, or Firm*—Calvin B. Ward (57) ABSTRACT

A light-emitting device and the method for making the same are disclosed. The device includes a substrate, a light-emitting structure and a light scattering layer. The light-emitting structure includes an active layer sandwiched between a p-type GaN layer and an n-type GaN layer, the active layer emitting light of a predetermined wavelength when electrons and holes from the n-type GaN layer and the p-type GaN layer, respectively, combine therein. The light scattering layer includes a GaN crystalline layer characterized by an N-face surface. The N-face surface includes features that scatter light of the predetermined wavelength. The light-emitting structure is between the N-face surface and the substrate.

4 Claims, 6 Drawing Sheets

GAN BASED LED WITH ETCHED EXPOSED SURFACE FOR IMPROVED LIGHT EXTRACTION EFFICIENCY AND METHOD FOR MAKING THE SAME

BACKGROUND OF THE INVENTION

Light emitting devices (LEDs) are an important class of solid-state devices that convert electric energy to light. Improvements in these devices have resulted in their use in light fixtures designed to replace conventional incandescent and fluorescent light sources. The LEDs have significantly longer lifetimes and, in some cases, significantly higher efficiency for converting electric energy to light.

The cost and conversion efficiency of LEDs are important factors in determining the rate at which this new technology will replace conventional light sources and be utilized in high power applications. Many high power applications require multiple LEDs to achieve the needed power levels. Individual LEDs are limited to a few watts. In addition, LEDs generate light in relatively narrow spectral bands. Hence, in applications requiring a light source of a particular color, the light from a number of LEDs with spectral emission in different optical bands is combined. Hence, the cost of many light sources based on LEDs is many times the cost of the individual LEDs.

The conversion efficiency of individual LEDs is an important factor in addressing the cost of high power LED light sources. Electrical power that is not converted to light in the LED is converted to heat that raises the temperature of the LED. Heat dissipation places a limit on the power level at which an LED operates. In addition, the LEDs must be mounted on structures that provide heat dissipation, which, in turn, further increases the cost of the light sources. Hence, if the conversion efficiency of an LED can be increased, the maximum amount of light that can be provided by a single LED can also be increased, and hence, reduce the number of LEDs needed for a given light source. In addition, the cost of operation of the LED is also inversely proportional to the conversion efficiency. Hence, there has been a great deal of work directed to improving the conversion efficiency of LEDs.

The spectral band generated by an LED, in general, depends on the materials from which the LED is made. LEDs commonly include an active layer of semiconductor material sandwiched between additional layers. For the purposes of this discussion, an LED can be viewed as having three layers, the active layer sandwiched between two other layers. These layers are typically deposited on a substrate such as sapphire. It should be noted that each of these layers typically includes a number of sub-layers. The final LED chip is often encapsulated in a clear medium such as epoxy. To simplify the following discussion, it will be assumed that the light that leaves the LED exits through the outer layer that is furthest from the substrate. This layer will be referred to as the top layer in the following discussion.

Improvements in materials have led to improvements in the efficiency of light generated in the active layer. However, a significant fraction of the light generated in the active layer is lost. Light that is generated in the active layer must pass through the top layer before exiting the LED. Since the active layer emits light in all directions, the light from the active region strikes the boundary between the top layer and the encapsulating material at essentially all angles from 0 to 90 degrees relative to the normal direction at the boundary. Light that strikes the boundary at angles that are greater than the critical angle is totally reflected at the boundary. This light is redirected toward the substrate and is likewise reflected back into the LED. As a result, the light is trapped within the LED until it strikes the end of the LED or is absorbed by the material in the LED. In the case of conventional GaN-based LEDs on sapphire substrates approximately 70% of the light emitted by the active layer is trapped between the sapphire substrate and the outer surface of the GaN. Much of this light is lost, and hence, the light conversion efficiency of these devices is poor.

Several techniques have been described to improve light extraction from LEDs, and hence, improve the light conversion efficiency of these devices. In one class of techniques, the top surface of the LED is converted from a smooth planar surface to a rough surface. Some of the light that is reflected at the top surface will return to the top surface at a location in which that light is now within the critical angle, and hence, escape rather than being again reflected. This technique depends on introducing scattering features into the top surface of the LED either by etching the surface, by depositing the features, or by growing the top layer under conditions that result in non-planar growth. Depositing the scattering features typically requires some form of lithography, and hence, significantly increases the cost of the resultant LEDs. Growing the surface so that it is non-planar is difficult to control and reproduce. Hence, etching the surface has significant advantages if the etching operation can be carried out without the use of lithographic masking operations or other costly fabrication steps.

To provide a suitable rough surface, the etching technique needs to create features that have a size that is a significant fraction of the wavelength of light generated by the LED. If the features are small compared to the wavelength of the generated light, the light will not be scattered by the features. Since the thickness of the top layer is typically only a few wavelengths of light at most, the etching technique must remove a significant amount of the top layer. In the case of LEDs constructed from GaN, this presents a serious problem, since the outer surface of the top layer is very difficult to etch. Hence, techniques based on exposing the surface to an etchant have failed to provide the desired surface features at an acceptable cost.

SUMMARY OF THE INVENTION

The present invention includes a light-emitting device and the method for making the same. The device includes a substrate, a light-emitting structure and a light scattering layer. The light-emitting structure includes an active layer sandwiched between a p-type GaN layer and an n-type GaN layer, the active layer emitting light of a predetermined wavelength when electrons and holes from the n-type GaN layer and the p-type GaN layer, respectively, combine therein. The light scattering layer includes a GaN crystalline layer characterized by an N-face surface. The N-face surface includes features that scatter light of the predetermined wavelength. The light-emitting structure is between the N-face surface and the substrate. In one aspect of the invention, the n-type GaN layer in the light-emitting structure is between the p-type GaN layer in the light emitting structure and the substrate. In another aspect of the invention, the light scattering layer includes a first GaN layer that is doped with Mg to a concentration of $10^{20}$ atoms/cm$^3$ or greater. The light scattering layer could also include a second GaN layer adjacent to the first GaN layer that is doped with Mg to a concentration less than $10^{20}$ atoms/cm$^3$.

DETAILED DESCRIPTION OF THE PREFERRED EMBODIMENTS OF THE INVENTION

Figure 1:
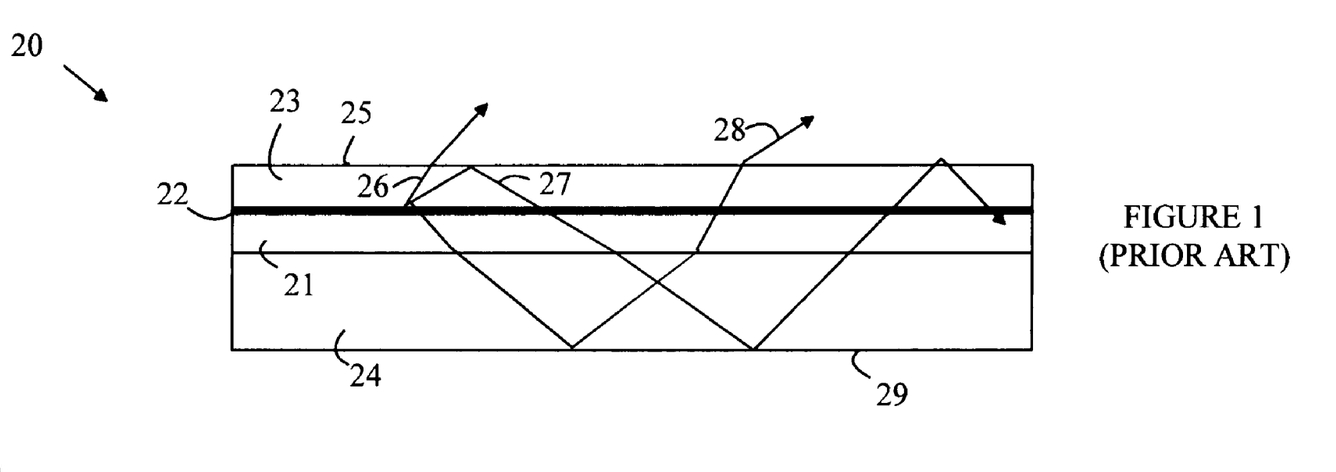
FIG. 1 is a simplified cross-sectional view of a prior art GaN-based LED.

The manner in which the present invention provides its advantages can be more easily understood with reference to FIG. 1, which is a simplified cross-sectional view of a prior art GaN-based LED. LED 20 is constructed by growing three layers on a sapphire substrate 24. The first layer 21 is an n-type GaN material. The second layer is a p-type GaN layer 23. The third layer 22 is an active layer that emits light when holes and electrons from layers 21 and 23 combine therein. As noted above, each of these layers may include a number of sub-layers. Since the functions of these sub-layers are well known in the art and are not central to the present discussion, the details of these sub-layers have been omitted from the drawings and the following discussion.

As noted above, light that is generated in layer 22 leaves layer 22 at all possible angles. Some of the light is emitted in a direction toward the top surface 25 of layer 23 and strikes surface 25 at angles that are less than the critical angle and escapes through surface 25. Such a light ray is shown at 26. Similarly, some of the light is directed toward substrate 24 and is reflected from the bottom of the substrate before reflecting back to surface 25. If this light strikes surface 25 at angles less than the critical angle, this light also escapes through surface 25. An exemplary light ray of this type is shown at 28. Unfortunately, most of the light generated in layer 22 strikes surface 25 at angles that are greater than the critical angle as shown at 27 and becomes trapped between the surface 25 and surface 29. This light will either be absorbed during its transit or exit through the ends of the LED. In practice, most of the trapped light is absorbed, and hence, lost. As a result, the efficiency of LED 20 is poor.

Figure 2:
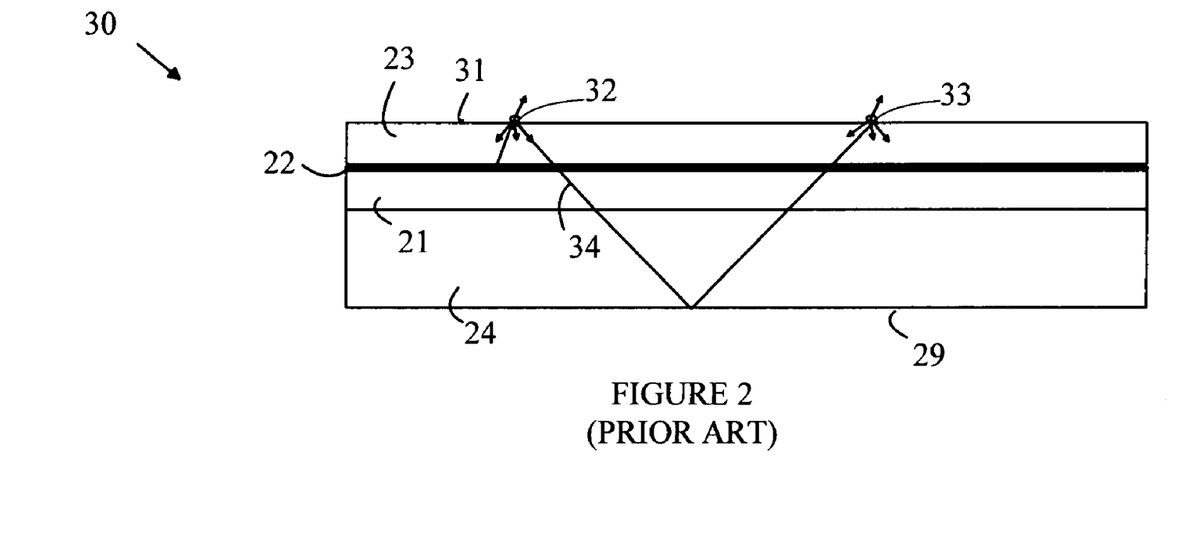
FIG. 2 is a simplified cross-sectional view of an LED that utilizes a rough surface to improve the light extraction efficiency of the LED.

As noted above, one method that has been suggested to improve the extraction efficiency of the LED involves altering surface 25 to provide scattering centers that provide a random reorientation of the light that strikes the surface and is reflected back into the LED. Refer now to FIG. 2, which is a simplified cross-sectional view of an LED that utilizes a rough surface to improve the light extraction efficiency of the LED. LED 20 is constructed by depositing layers 21-23 on substrate 24 in the same manner as LED 20 described above. The top surface 31 of layer 23 is modified to introduce scattering centers on the surface. Exemplary scattering centers are shown at 32 and 33; however, it is to be understood that surface 31 is covered with such scattering centers. When light leaving layer 22 strikes surface 31, part of the light will strike the surface at angles less than the critical angle and escape. The remaining light will be scattered back into layer 23 at a number of different angles and will be reflected from boundary 29 back toward surface 31. One such ray is shown at 34. When ray 34 strikes surface 31 at scattering center 33, the light will again be scattered with part of the light exiting through surface 31 and part being scattered back toward boundary 29. If layers 21-23 allow a few reflections before the light is absorbed, a significant improvement in the light extraction efficiency can be obtained.

As noted above, ideally, the scattering features would be introduced by etching the surface of layer 23 after the layer has been deposited in the normal fabrication process. Unfortunately, the surface obtained when GaN is grown on a sapphire substrate is highly resistant to etching procedures that would yield a rough surface. Hence, a simple etching procedure is not economically feasible.

The present invention is based on the observation that the GaN crystal face that is exposed on surface 25 when the GaN layers are grown on sapphire in the conventional manner is the Ga face of the crystal. In the conventional fabrication schemes, the N-face is adjacent to the sapphire substrate and the Ga-face is exposed on surface 25. The Ga-face is highly resistant to etching. If the N-face were exposed on surface 25, the surface could be etched using conventional etching techniques to provide the roughened surface needed to improve light extraction. The present invention is based on the observation that by changing the deposition process during the growth of layer 23, the crystal faces are flipped such that the top layer exposes the N-face of the GaN crystal. This layer can then be etched to provide a rough surface that improves the efficiency of extraction of the light from the LED.

Figure 3:
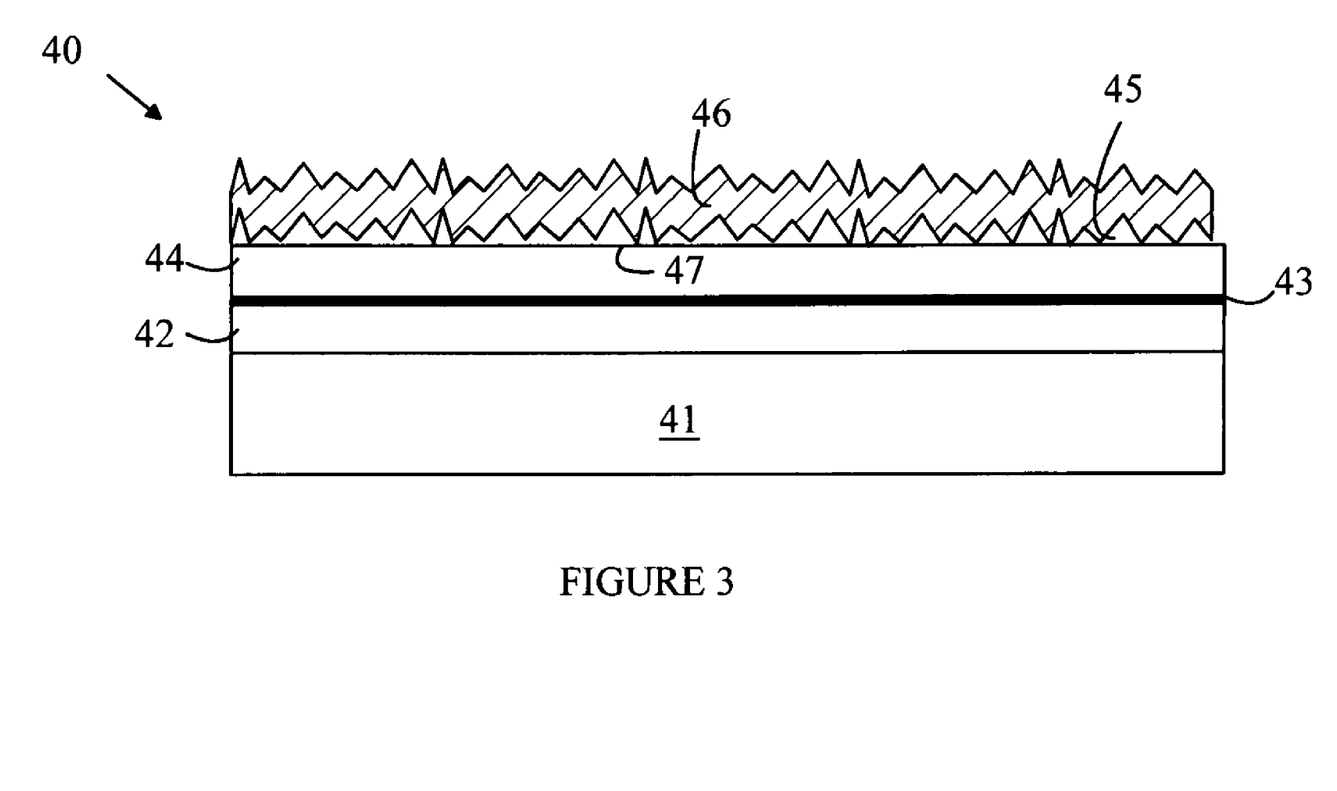
FIG. 3 is a cross-sectional view of a portion of an LED according to one embodiment of the present invention.

Refer now to FIG. 3, which is a cross-sectional view of a portion of an LED according to one embodiment of the present invention. LED 40 is constructed on a sapphire substrate 41 by depositing layers 42-44. Layer 42 is an n-type GaN layer; layer 43 is the active layer, and layer 44 is a p-type GaN layer in which the Ga-face is exposed at boundary 47. A roughened layer of p-type GaN in which the N-face is exposed 45 is constructed on layer 44 by growing a layer of GaN that has been doped with high concentrations of Mg that are greater than or equal to $10^{20}$ atoms/cm$^3$ using MOCVD. It is known in the art that the high level of Mg doping results in the exposed crystal face being flipped from the Ga-face to the N-face. This flipped layer is then etched to provide the roughened surface shown in the figure. Finally, a transparent electrode 46 is deposited over the roughened surface to provide current spreading. Electrode 46 is preferably a layer of ITO. In practice, a metallic electrode is deposited on top of layer 46, and a portion of the stack of layers is etched down to layer 42 to provide the other electrode for powering the device. These details are conventional in the art, and hence, have been omitted to simplify the drawing.

The highly doped p-type GaN is a relatively poor electrical conductor compared to the GaN in layer 44, which is also a relatively poor conductor compared to the n-type material of layer 42. Hence, the thickness of this material is preferably as thin as possible. In the embodiment shown in FIG. 3, the layer that is etched to provide layer 45 is uniformly doped with Mg. In this case, the layer thickness is a trade-off between minimizing the thickness to reduce the voltage drop across the layer and providing a layer that is thick enough to yield etch features that will efficiently scatter the light generated in active layer 43. The scattering features preferably have dimensions that are larger than the wavelength of the light generated in active layer 43. The wavelength of light in GaN LEDs is typically in the range of 200-500 nm in air. However, the GaN has a very high index of refraction, and hence, the features need only be in the 100 to 300 nm range, depending on the specific materials used in the LED. Accordingly, layer 45 preferably has a maximum thickness that is less than 1.5 microns.

Figure 4:
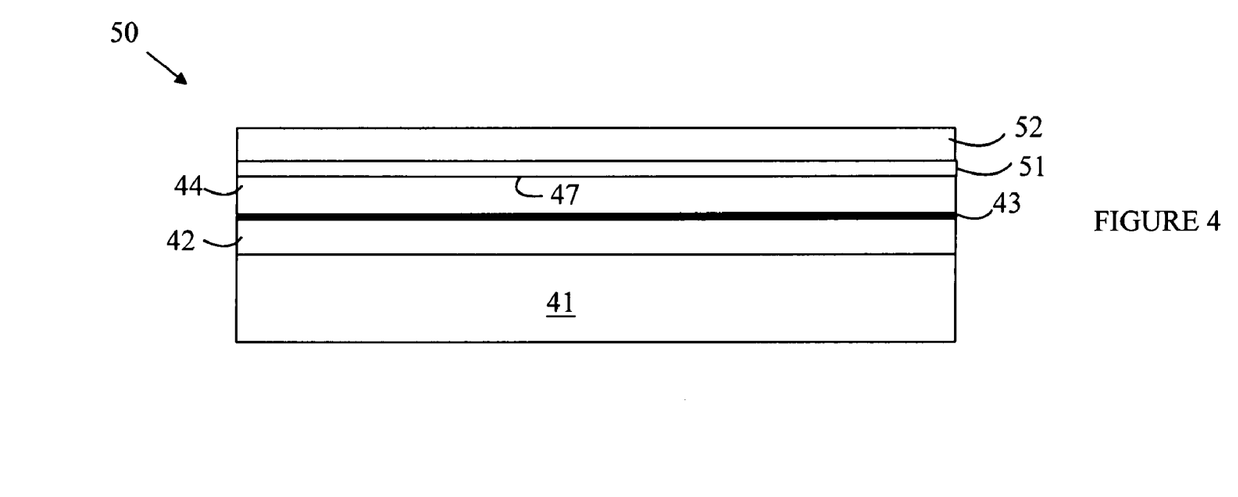
FIG. 4 is a cross-sectional view of another embodiment of an LED according to the present invention at the stage in the fabrication just prior to etching the top surface.
Figure 5:
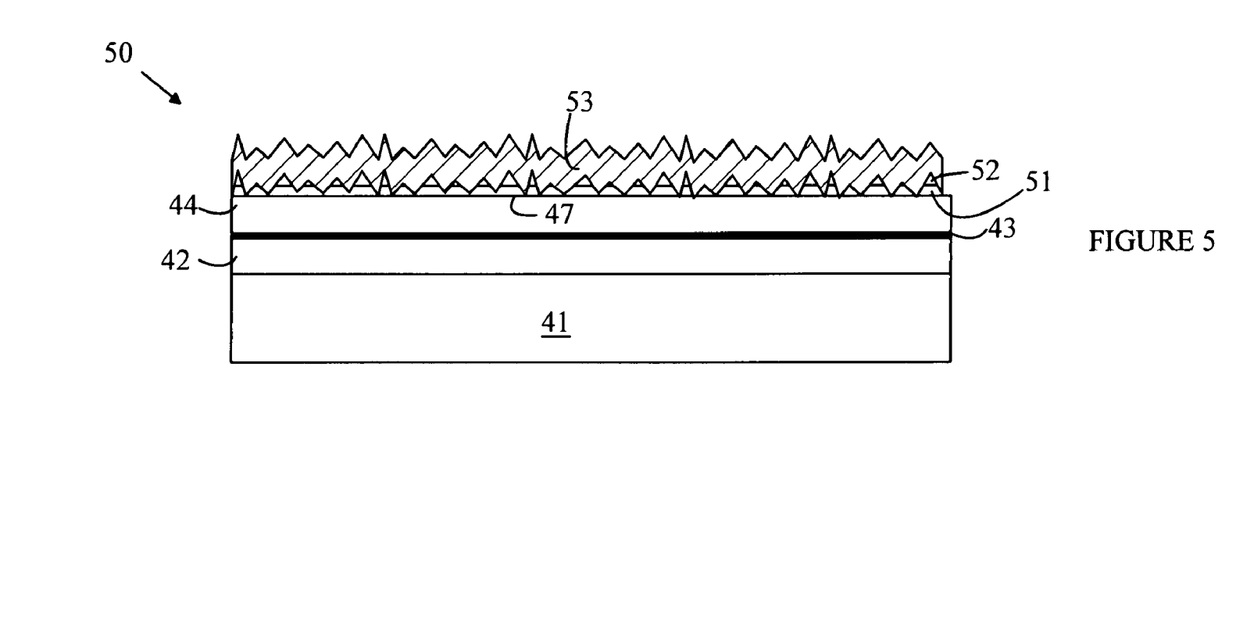
FIG. 5 is a cross-sectional view of LED 50 after the N-face layers have been etched and a transparent electrode has been deposited over the etched layers.

Refer now to FIG. 4, which is a cross-sectional view of another embodiment of an LED according to the present invention at the stage in the fabrication just prior to etching the top surface. The initial construction of LED 50 is the same as that described above for LED 40 shown in FIG. 3. After the p-type layer 44 is grown, a thin transition layer 51 of highly Mg doped p-type GaN is grown on layer 44 using MOCVD in a manner analogous to that described above. The layer is only thick enough to allow the crystal orientation to flip such that the N-face of the GaN is exposed. A second thicker layer 52 of p-type GaN having the conventional doping density (i.e., $<10^{20}$ atoms/cm$^3$) is then grown on transition layer 51. It can be shown that layer 52 also has its N-face in the same orientation as that of layer 51. Since layer 52 has a lower Mg doping, the problems resulting from the increased resistivity of the layer being etched are reduced. Refer now to FIG. 5, which is a cross-sectional view of LED 50 after the N-face layers have been etched using a KOH solution and a transparent electrode 53 has been deposited over the etched layers.

In the above-described embodiments, a p-type GaN layer having an exposed N-face is etched to provide the roughened surface that facilitates the extraction of the light from the LED. However, embodiments in which an n-type GaN layer is etched to provide this function can also be constructed. In the above-described embodiments of the present invention, the LEDs are three layer devices in which the active layer is sandwiched between a p-type layer and an n-type layer. The resulting structure is often referred to as a p-i-n diode. As noted above, the p-type layer can cause problems both in terms of current spreading, diffusion, and resistance. In this regard it should be noted that the n-type and p-type layers may be viewed as resistors that dissipate power, and this dissipated power does not generate any light. Accordingly, high resistance layers result in lower efficiencies and high operating temperatures.

More complex LED designs attempt to reduce these problems by minimizing the thickness of the p-type layer. In one such device, the outer layers are both n-type layers to provide better current spreading. Since such LEDs are known in the art, they will not be discussed in detail here. For the purposes of the present discussion, it is sufficient to note that a tunnel diode junction is introduced with the body of the LED to provide a transition of a p-type layer. That is, the LED has an n-p-i-n structure, in which the n-p junction is a reverse-biased tunnel diode, and the p-type layer is relatively thin. Since the current spreading function is achieved in the n-type layers, the p-type layer can be quite thin, and hence, the problems associated with high resistance of p-type materials are significantly reduced. For the correct choice of materials and dopings, it can be shown that the losses introduced by the tunnel junction are more than offset by improvements in current spreading and lower device resistance.

Figure 6:
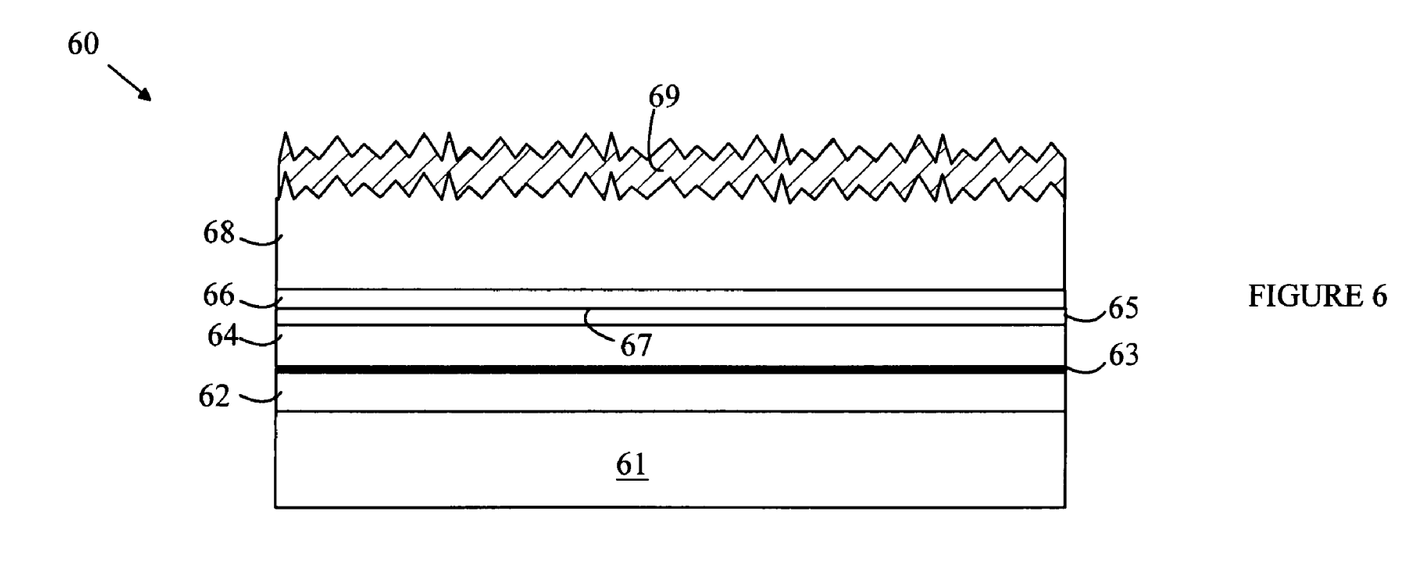
FIG. 6 is a cross-sectional view of a portion of an LED according to another embodiment of the present invention.

Refer now to FIG. 6, which is a cross-sectional view of a portion of an LED according to another embodiment of the present invention. LED 60 utilizes a reverse-biased tunnel junction as described above to provide the n-p-i-n structure. LED 60 is fabricated on a sapphire substrate 61 by growing an n-type GaN layer 62, an active layer 63, and a p-type GaN layer 64 in a manner analogous to that described above. A tunnel junction is created by growing a p-type layer 65 of GaN and an n-type layer 66 of GaN. The p-type layer is doped with Mg to a concentration of $10^{20}$ atoms/cm$^3$ or greater using MOCVD. This layer is grown to a sufficient thickness to allow the crystal orientation to flip such that the N-face is exposed at junction 67. An n-doped layer 66 of GaN is then grown to provide the tunnel junction. This layer is typically doped with Si atoms to a density of $10^{19}$ atoms/cm$^3$ or greater. Finally, a thicker GaN n-type layer 68 is grown on layer 66. As noted above, once the crystal orientation has flipped, the orientation remains flipped. Hence, layers 66 and 68 are also grown with their N-face upwards. Accordingly, the upper surface of layer 68 can be etched with NaOH to provide the rough surface needed to enhance the light extraction. A transparent electrode 69 is then deposited over the roughened surface in a manner analogous to that described above.

In the above-described embodiments, the light is extracted through the top, roughened surface of the LED. However, embodiments in which the light is extracted through the sapphire substrate can also be constructed. In such embodiments, the transparent electrodes on the top of the LED described above are replaced with a reflective material that acts as an electrode and a mirror.

Figure 7:
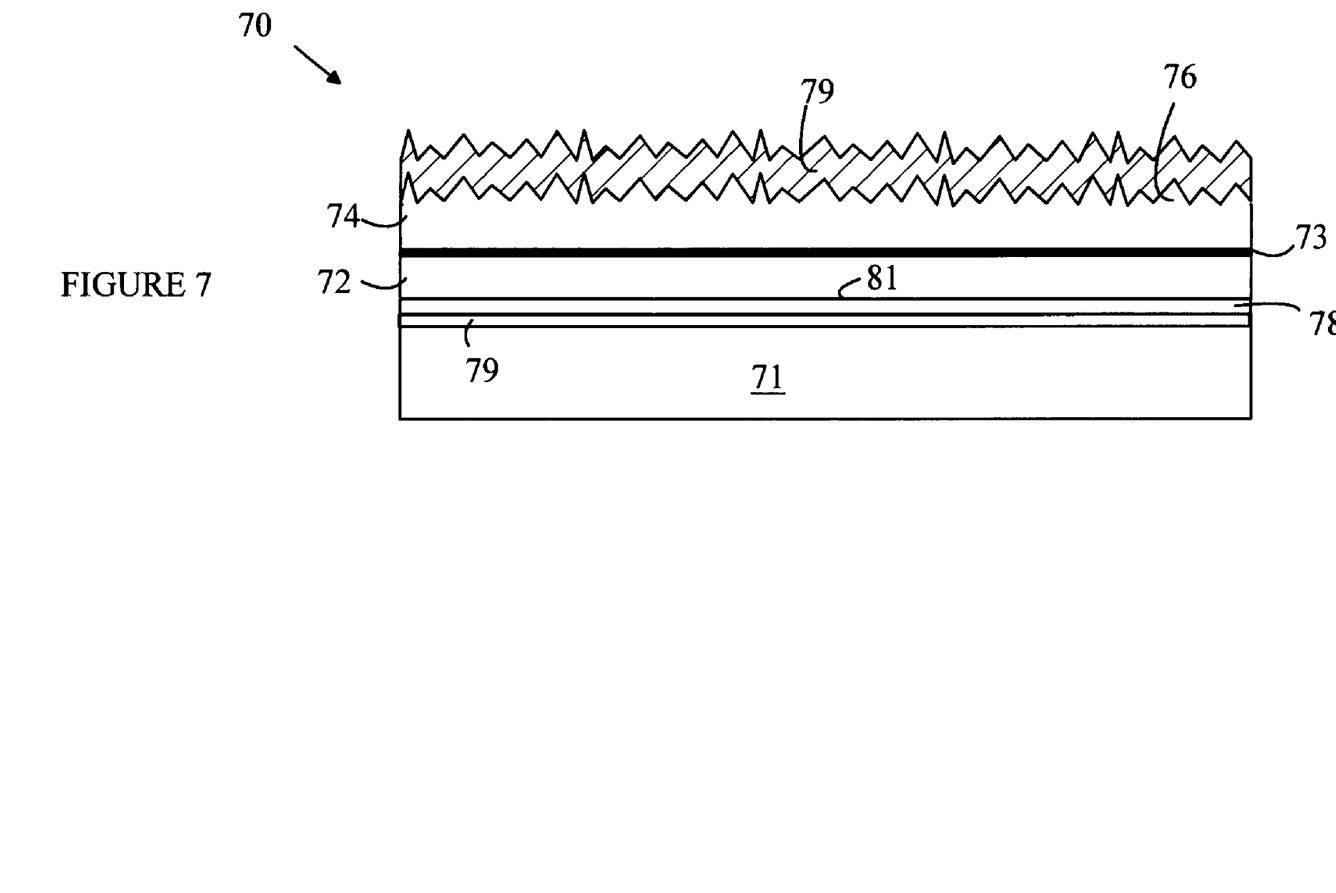
FIG. 7 is a cross-sectional view of a portion of another embodiment of an LED according to the present invention.

In the above-describes embodiments of the present invention, the n-doped layer of the LED is grown first over the substrate. This configuration is preferred over configurations in which the p-type layer is grown first followed by the active layer and the n-type layer for a number of reasons. In particular, the preferred configuration provides better current spreading and avoids problems associated with the diffusion of the p-type dopants. However, embodiments of the present invention in which the p-type layer is grown first can be constructed in situations in which these problems are overcome or are not of importance. Refer now to FIG. 7, which is a cross-sectional view of a portion of another embodiment of an LED according to the present invention. LED 70 utilizes the p-type first configuration discussed above. Since the layer of GaN that causes the crystal orientation to flip is inherently p-type because of the high levels of Mg doping, this layer is grown first in LED 70. In particular, after any buffer layers such as layer 79 are grown on substrate 71, a highly Mg doped GaN layer 78 is grown to a sufficient thickness to cause the crystal orientation to flip such that the N-face is on surface 81 of layer 78. The conventional p-type layer 72, active layer 73, and n-type layer 74 are then grown. As noted above, once the crystal orientation has flipped, the new orientation is maintained. Hence the upper surface of layer 74 has the N-face of the GaN exposed. This surface is then etched in a manner analogous to that described above to create the scattering features 76. An electrode 79 is then deposited over the etched surface. The electrode can either be opaque or transparent depending on the surface through which the light is extracted.

Figure 8:
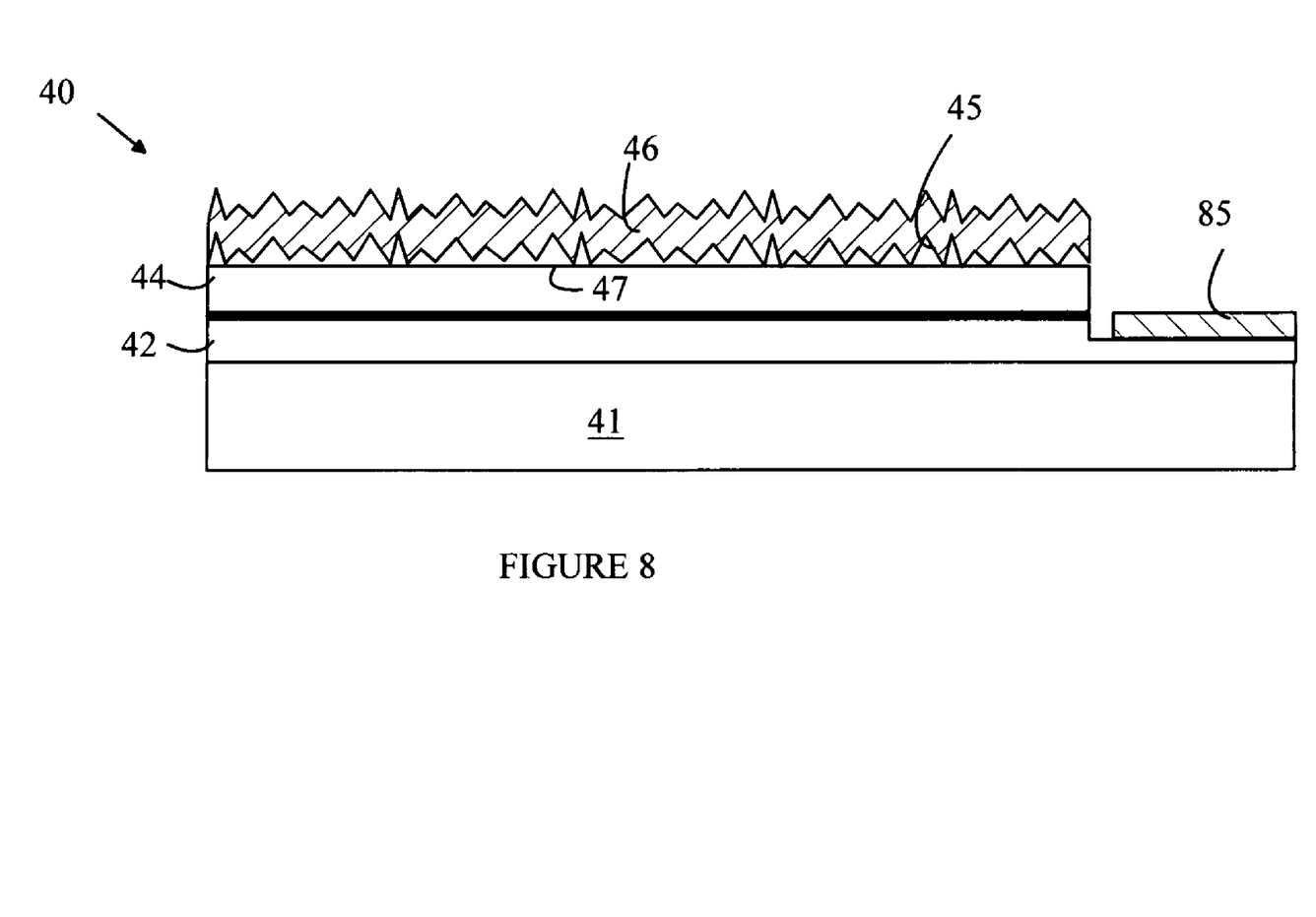
FIG. 8 is a cross-sectional view of the LED shown in FIG. 3 after a mesa has been etched and an electrode has been deposited.

The above-described drawings have only a shown a portion of the various embodiments of the LEDs according to the present invention to simplify the drawings and discussion. In practice, the multi-layer structure shown in the above figures is etched to expose the n-type layer under the active layer (or p-layer in the case of FIG. 7). An electrode is then constructed on the mesa created by the etching operation. Such an arrangement is shown in FIG. 8, which is a cross-sectional view of the LED shown in FIG. 3 after the mesa has been etched and electrode 85 has been deposited.

The above-described embodiments of the present invention have utilized layers of GaN. However, the present invention can be applied to devices constructed from any alloy in the InAlGaN system. Accordingly, the term "GaN" is defined to include any alloy in this system.

The embodiments discussed above rely on etching the exposed N-face of the GaN. Since this surface is reactive, conventional acid etches can be utilized such as phosphoric acid. The surface can also be etched utilizing photoelectrochemical etching with KOH.

Various modifications to the present invention will become apparent to those skilled in the art from the foregoing description and accompanying drawings. Accordingly, the present invention is to be limited solely by the scope of the following claims.

What is claimed is:

1. A method for making a light-emitting diode LED comprising:

fabricating a light-emitting structure on a substrate, said light emitting structure comprising an active layer sandwiched between a p-type GaN layer and an n-type GaN layer, said active layer emitting light of a predetermined wavelength when electrons and holes from said n-type GaN layer and said p-type GaN layer, respectively, combine therein, said light-emitting structure exposing a Ga-face of said p-type GaN on an exposed surface thereof;

depositing a p-type GaN transition structure on said exposed surface, said transition structure having an exposed N-face on an exposed surface thereof; and etching said exposed N-face of said transition structure to generate features that scatter light of said predetermined wavelength.

2. The method of claim 1 wherein said exposed N-face of said transition structure is etched with NaOH.

3. The method of claim 1 wherein said transition structure comprises a layer of GaN doped with Mg to a concentration greater than or equal to $10^{20}$ atoms/cm$^3$.

4. The method of claim 1 wherein said transition structure comprises a layer of GaN doped with Mg to a concentration less than $10^{20}$ atoms/cm$^3$.

* * * * *

UNITED STATES PATENT AND TRADEMARK OFFICE
CERTIFICATE OF CORRECTION

PATENT NO. : 7,674,639 B2
APPLICATION NO. : 11/504435
DATED : March 9, 2010
INVENTOR(S) : Lester Page 1 of 1

It is certified that error appears in the above-identified patent and that said Letters Patent is hereby corrected as shown below:

Column 6, Line 29: replace "above-describes" by --above-described--.

Column 7, Line 18: replace "LED" should be --(LED)--.

Signed and Sealed this

Eleventh Day of May, 2010

David J. Kappos
*Director of the United States Patent and Trademark Office*